US005761783A

United States Patent [19]

Osawa et al.

[11] Patent Number: 5,761,783

[45] Date of Patent: Jun. 9, 1998

[54] INK-JET HEAD MANUFACTURING METHOD

[75] Inventors: Seiichi Osawa, Oyama; Takeo Komiyama, Higashikurume, both of Japan

[73] Assignee: Citizen Watch Co., Ltd., Tokyo, Japan

[21] Appl. No.: 714,077

[22] PCT Filed: Mar. 28, 1995

[86] PCT No.: PCT/JP95/00583

§ 371 Date: Sep. 25, 1996

§ 102(e) Date: Sep. 25, 1996

[87] PCT Pub. No.: WO95/26271

PCT Pub. Date: Oct. 5, 1995

[30] Foreign Application Priority Data

Mar. 29, 1994 [JP] Japan .................................... 6-058423

[51] Int. Cl.[6] ............................ H01L 41/22; B41J 2/045; B41J 2/16

[52] U.S. Cl. .......................... 29/25.35; 29/890.1; 347/70; 347/71

[58] Field of Search ................................ 29/25.35, 890.1; 216/27; 347/70, 71, 72; 333/368; 451/41

[56] References Cited

U.S. PATENT DOCUMENTS

| | | | |
|---|---|---|---|
| 5,128,694 | 7/1992 | Kanayama | 347/72 |
| 5,144,342 | 9/1992 | Kubota | 347/70 |
| 5,365,645 | 11/1994 | Walker et al. | 29/890.1 X |
| 5,479,684 | 1/1996 | Murphy | 29/890.1 X |
| 5,548,894 | 8/1996 | Muto | 29/890.1 |
| 5,649,346 | 7/1997 | Katsuumi et al. | 29/25.35 |

FOREIGN PATENT DOCUMENTS

| | | |
|---|---|---|
| 61-59914 | 12/1986 | Japan . |
| 1-196350 | 8/1989 | Japan . |
| 3-72441 | 3/1991 | Japan . |
| 3-73347 | 3/1991 | Japan . |
| 4-99637 | 3/1992 | Japan . |
| 5-318736 | 12/1993 | Japan . |
| 5-338154 | 12/1993 | Japan . |
| 6-226971 | 8/1994 | Japan . |
| 06344555 A | 12/1994 | Japan . |

*Primary Examiner*—Peter Vo
*Attorney, Agent, or Firm*—Armstrong, Westerman, Hattori, McLeland & Naughton

[57] ABSTRACT

An ink-jet head comprises: an insulating base (10); a plurality of juxtaposed multilayer piezoelectric elements (20) each formed by alternately stacking conductive members and piezoelectric plates polarized in the direction of the thickness and having a lowermost layer (25) and an uppermost layer (26) which are nondriven layers which are not distorted even when voltage is applied thereto; an elastically bendable oscillation plate (30); and a flow passage plate (40) provided with a plurality of ink outlets(43) at the front end thereof, and a plurality of juxtaposed ink chambers (41) connected to the ink outlets (43). The lowermost layers (25) of the multilayer piezoelectric elements (20) are bonded to the upper surface of the base (10), and the oscillation plate (30) is bonded to the uppermost layers (26) of the multilayer piezoelectric elements (20). The flow passage plate (40) is bonded to the upper surface of the oscillation plate (30) with the ink chambers (41) arranged in the direction of distortion of the multilayer piezoelectric elements (20). A front member (50) is bonded to the front end surfaces of the multilayer piezoelectric elements (20) and a front end portion of the oscillation plate (30).

5 Claims, 9 Drawing Sheets

INK-JET HEAD MANUFACTURING METHOD

TECHNICAL FIELD

The present invention relates to an ink-jet head which jets ink particles onto selected positions on an image recording medium, and a method of manufacturing the same.

BACKGROUND ART

Ink-jet printers among nonimpact printers progressively extending their market in recent years are based on the simplest principle and suitable for color printing. The so-called drop-on-demand (DOD) ink-jet printers which jets ink particles only when dots are formed are major ones among ink-jet printers.

Representative head systems for DOD ink-jet printers are, for example, a Kayser head system disclosed in JP-B No. 53-12138 and a thermal-jet head system disclosed in JP-B No. 61-59914.

A Kayser ink-jet head disclosed in JP-B No. 53-12138 is difficult to down-size, and a thermal-jet ink-jet head disclosed in JP-B No. 61-59914 has a problem that the ink burns and sticks to the ink-jet head because intense heat is applied to the ink.

An ink-jet head proposed to overcome both the foregoing disadvantages employs piezoelectric elements having a piezoelectric strain constant $d_{33}$ (hereinafter referred to as "$d_{33}$ mode ink-jet head").

The $d_{33}$ mode ink-jet head employs thin pieces of a piezoelectric material (piezoelectric elements). Electrodes are formed on the opposite surfaces of the piezoeletric element, and the piezoelectric element is polarized in the direction of an electric field created between the electrodes so that the piezoelectric element has the piezoelectric strain constant $d_{33}$. When an electric field is created across the electrodes, the piezoelectric element expands and contracts in the direction of the thickness (the $d_{33}$ direction) to pressurize an ink chamber.

Known $d_{33}$ mode ink-jet heads are disclosed in JP-A Nos. 3-10845 and 3-10846.

FIGS. 11 and 12 show a structure of the ink-jet head disclosed in JP-A No. 3-10846.

The ink-jet head disclosed in JP-A No. 3-10846 comprises a cover block 211 provided with two recesses, and a piezoelectric element block 213 which expands and contracts in the direction of the thickness (the $d_{33}$ direction) when a voltage is applied thereto.

The piezoelectric block 213 has a layered structure. The piezoelectric block 213 is made of lead titanate zirconate. The piezoelectric block 213 is provided with grooves 216*a*, 216*b*, 216*c* and 216*d* extending perpendicularly to the paper. A portion of the piezoelectric block 213 between the grooves 216*a* and 216*b* is a first driving piezoelectric element 217*a*. The first driving piezoelectric element 217*a* is provided with a first electrode 215*a*. A portion of the piezoelectric block 213 between the grooves 216*c* and 216*d* is a second driving piezoelectric element 217*b*. The second driving piezoelectric element 217*b* is provided with a second electrode 215*b*.

The two recesses in the cover block 211 are covered with an oscillation plate 212. One of the recesses in the cover block 211 and the oscillation plate 212 define a first ink chamber 218*a*. The other recess in the cover block 211 and the oscillation plate 212 define a second ink chamber 218*b*. The first ink chamber 218*a* is connected to a first nozzle 219*a*. The second ink chamber 218*b* is connected to a second nozzle 219*b*.

In this ink-jet head, when a voltage is applied to, for example, the first electrode 215*a*, the first driving piezoelectric element 217*a* expands in the direction of the thickness (the direction $d_{33}$). Consequently, the oscillation plate 212 is bent in the same direction to pressurize the first ink chamber 218*a*, whereby an ink particle is jetted through the first nozzle 219*a*.

The prior art ink-jet head disclosed in JP-A No. 3-10845 is substantially the same in principal constitution as the ink-jet head disclosed in JP-A No. 3-10845.

The foregoing prior art ink-jet head has the following problems.

As is obvious from FIGS. 11 and 12, the respective front and back surfaces of the piezoelectric block 213, and the electrodes 215*a* and 215*b* are exposed, and the open ends of the nozzles 219*a* and 219*b* are flush with the front end surface. Therefore, there is the possibility that the ink leaked from the nozzles 219*a* and 219*b* spreads over the front and back surfaces of the piezoelectric block 213, and the electrodes 215*a* and 215*b* to short the electrodes 215*a* and 215*b*. Particularly, since the distance between the electrodes 215*a* and 215*b* is very short in a piezoelectric block of a layered structure, it is possible that breakdown between the electrodes is caused by moisture contained in the atmosphere in an environment of high humidity, which causes a problem in the safety of operation.

An apparatus, such as disclosed in JP-A No. 4-77669, which jet a liquid, such as ink, through fine nozzles closes the nozzles by pressing a cap against the front ends of the nozzles while the nozzles are not used to prevent the clogging of the nozzles due to the drying of the ink remaining in the nozzles, and is provided with a cleaning mechanism having a blade for wiping off the liquid leaked through the nozzles. It is preferable that the ink-jet head is provided with such a cap and a cleaning mechanism.

However, when the front end surfaces of the piezoelectric block 213 and the electrodes 215*a* and 215*b* are exposed in a plane flush with the open ends of the nozzles 219*a* and 219*b*, it is possible that the ink flows along the cap and the blade and adheres to the end surfaces of the piezoelectric block 213 and the electrodes 215*a* and 215*b* to cause breakdown between the electrodes 215*a* and 215*b*.

Such a problem may be solved by shifting the front end surfaces of the piezoelectric block 213 and the electrodes 215*a* and 215*b* from a position corresponding to a plane including the open ends of the nozzles 219*a* and 219*b*, which, however, makes only the front surface of the cover block 211 to be subjected to the pressure of the cap and the frictional force of the cleaning blade.

Consequently, it is highly possible that the cover block 211 is distorted and damaged when the cap is brought into contact with the front surface of the cover block repeatedly and the cleaning blade rubs the front surface repeatedly. The cover block 211 is provided with the nozzles 219*a* and 219*b* through which ink particles are jetted, and ink particles will be jetted in wrong directions even if the cover block 211 is distorted even slightly, and thereby print quality is deteriorated.

In the foregoing prior art ink-jet head, the driving piezoelectric elements 217*a* and 217*b* are supported by nondriven portions (portions 217*c* in FIGS. 11 and 12) of the piezoelectric block 213. Since the piezoelectric block 213 of a layered structure is fabricated by alternately laminating layers of lead titanate zirconate and electrode films, forming the grooves 216*a*, 216*b*, 216*c* and 216*d* to space apart the driving piezoelectric elements 217*a* and 217*b* and the nondriven portions 217*c*, the nondriven portions 217*c* have electrode films 215*c*.

Accordingly, when reaction force resulting from the distortion of the driving piezoelectric elements 217*a* and 217*b* is sustained only by the nondriven portions 217*c*, there is the possibility that the nondriven portions 217*c* are unable to withstand the reaction force and the ink-jet head is broken up.

DISCLOSURE OF THE INVENTION

The present invention is intended to solve such problems in the foregoing $d_{33}$ mode ink-jet head.

According to the present invention, an ink-jet head comprises an insulating base, a plurality of juxtaposed multilayer piezoelectric elements, an elastic oscillation plate and a flow passage plate. Each multilayer piezoelectric element is formed by alternately stacking conductive members and piezoelectric plates polarized in the direction of the thickness, and the opposite end layers of the multilayer piezoelectric element are a first and a second nondriven layer which will not be distorted when voltage is applied thereto. The flow passage plate is provided in its front end with a plurality of ink outlets, and a plurality of juxtaposed ink chambers connected to the ink outlets.

The surface of the first nondriven layer of each multilayer piezoelectric element is bonded to the base, and one of the flat surfaces of the oscillation plate is bonded to the surface of the second nondriven layer of the multilayer piezoelectric element. The flow passage plate is bonded to the other flat surface of the oscillation plate with the ink chambers disposed in the direction of displacement of the multilayer piezoelectric elements.

A front member made of a rigid material is bonded to the base and a front end portion of the first flat surface of the oscillation plate is bonded to the front member. Thus, a portion of the oscillation plate around the ink outlets is fixed to the front member and, consequently, no oscillation is generated around the ink outlets. Therefore, there is no possibility that the sectional area of the ink outlets is changed by the oscillation of the oscillation plate when forming ink particles and, consequently, there is no possibility that ink particles are broken up or atomized by the oscillation.

The front member supports a front end portion of the flow passage plate through the oscillation plate. A back member made of a rigid material is bonded to the base, a back end portion of the first flat surface of the oscillation plate is bonded to the back member, and a front end portion of the flow passage plate is supported through the oscillation plate by the front member.

Since the front and the back portions of the flow passage plate are supported by the front member made of a rigid material and the back member made of a rigid material, the flow passage plate can be firmly fixed. Therefore, the distortion of each multilayer piezoelectric element can efficiently be converted into a change in the volume of the corresponding ink chamber. Consequently, the ink can be jetted by a uniform pressure.

Furthermore, according to the present invention, the front end surfaces of the multilayer piezoelectric elements may be bonded to the front member, and the back end surfaces of the multilayer piezoelectric elements may be bonded to the back member.

When the front and the back end surfaces of the multilayer piezoelectric elements are bonded to respectively the front member and the back member, the front and the back surfaces of the multilayer piezoelectric elements are in close contact with respectively the front member and the back member, so that the short-circuiting of the multilayer piezoelectric elements due to the wetting of the multilayer piezoelectric elements with the ink leaked through the ink outlets or with moisture in a highly humid environment can be prevented.

According to the present invention, the plurality of juxtaposed multilayer piezoelectric elements may be alternated with driving multilayer piezoelectric elements to which voltage is applied, the multilayer piezoelectric elements between the driving multilayer piezoelectric elements may be used as supporting multilayer piezoelectric elements to which any voltage is not applied, and the flow passage plate may be disposed with its ink chambers disposed in the direction of displacement of the driving multilayer piezoelectric elements.

When the ink-jet head is thus constructed, a reaction force resulting from the distortion of the driving multilayer piezoelectric elements is sustained by the supporting multilayer piezoelectric elements and hence the distortion of the driving multilayer piezoelectric elements can efficiently be transmitted to the oscillation plate.

According to the present invention, the front surface of the front member may be flat, and the front surface of the front member, the front end of the flow passage plate and the front end of the oscillation plate may be included in a plane.

When the ink-jet head is thus constructed, the plane including the front surface of the front member, the front end of the flow passage plate and the front end of the oscillation plate serves as a surface of a support wall to which the cap for preventing the clogging of the ink outlets is pressed and which is subjected to the action of the cleaning blade for cleaning the ink outlets.

A nozzle plate provided with a plurality of nozzle holes may be bonded to the front surface of the front member, the front end of the flow passage plate and the front end of the oscillation plate so that the nozzle holes are connected to the ink outlets of the flow passage plate.

When the nozzle holes requiring precision machining are formed in the nozzle plate separate from the flow passage plate, the nozzle holes can be formed with improved machining accuracy.

The foregoing ink-jet heads can be manufactured with a very high efficiency by the following ink-jet head manufacturing method in accordance with the present invention.

According to a first aspect of the present invention, an ink-jet head manufacturing method comprises a multilayer piezoelectric block bonding process, a slit forming process, a front member bonding process, a back member bonding process, an oscillation plate bonding process and a flow passage plate bonding process.

The multilayer piezoelectric block bonding process forms a multilayer piezoelectric block having alternately stacked conductive elements and plate-shaped piezoelectric elements polarized in the direction of the thickness, and a first and a second nondriven layer which are not distorted when voltage is applied thereto forming the opposite end layers with respect to the direction of stacking. The first nondriven layer of the multilayer piezoelectric block is bonded to a base.

The slit forming process forms a plurality of longitudinal slits of a depth extending at least from the surface of the second nondriven layer to the middle of the first nondriven layer at fixed intervals in the multilayer piezoelectric block to form a plurality of multilayer piezoelectric elements spaced by the slits.

In the front member bonding process, an insulating front member made of a rigid material is bonded to the front end surfaces of the base and the multilayer piezoelectric block.

In the back member bonding process, an insulating back member made of a rigid material is bonded to the back end surfaces of the base and the multilayer piezoelectric block.

In the oscillation plate bonding process, the surfaces of the second nondriven layers of the multilayer piezoelectric elements, an end portion of the front member on the side of a portion in contact with the second nondriven layers, and an end portion of the back member on the side of a portion in contact with the second nondriven layers are ground simultaneously so that the surfaces of the second nondriven layers of the multilayer piezoelectric elements, the end portion of the front member, and the end portion of the back member on the side of a portion in contact with the second nondriven layers are flush with each other, and the first flat surface of the oscillation plate is bonded to the surfaces of the second nondriven layers of the The flow passage plate bonding process prepares a flow passage plate provided in its front end with a plurality of ink outlets, and a plurality of juxtaposed ink chambers connected to the ink outlets, and bonds the flow passage plate to the other flat surface of the oscillation plate with its ink chambers disposed in the direction of distortion of the multilayer piezoelectric elements.

The ink-jet head manufacturing method of the present invention may further comprise a nozzle plate bonding process. The nozzle plate bonding process prepares a nozzle plate provided with a plurality of nozzle holes, grinds simultaneously the front surface of the front member, the front end of the oscillation plate and the front end of the flow passage plate in a plane after the processes for bonding together the multilayer piezoelectric block, the oscillation plate, the front member and the flow passage plates, and then bonds the nozzle plates to the ground front surface of the front member, the ground front end of the oscillation plate and the ground front end of the flow passage plate with the nozzle holes connected to the ink outlets of the flow passage plate.

In a second aspect of the present invention, an ink-jet head manufacturing method may be embodied in the following modes.

In a first mode, the multilayer piezoelectric block bonding process exposes at least a back portion of a surface of the base to which the multilayer piezoelectric elements are bonded, and an electrode film is formed at least in exposed portions of the front and the back surfaces of the multilayer piezoelectric block and the exposed back portion of the surface of the base after the completion of the multilayer piezoelectric block bonding process.

In a slit forming process, slits are formed with a depth extending from the surface of the second nondriven layer of the multilayer piezoelectric element to the middle of the thickness of the base so as to extend to the back end of the base.

Thus, the electrode film formed in the back portion of the surface of the base forms a driving collecting electrode electrically connected to the electrode film formed on the back surface of the multilayer piezoelectric block, and the electrode film formed on the front surface of the multilayer piezoelectric block forms a common collecting electrode.

When the driving collecting electrode and the common collecting electrode are thus formed, the plurality of multilayer piezoelectric elements and the driving electrodes for driving the former can simultaneously be formed by formation of the electrode film and the slit processing. Therefore, the ink-jet head can be manufactured with a very high efficiency. Since external signal lines for driving the multilayer piezoelectric elements are connected on the base, the multilayer piezoelectric elements can easily be connected to the external signal lines with an FPC (flexible printed cable) or by wire bonding, etc.

In the first mode, the multilayer piezoelectric block is divided and the multilayer piezoelectric elements are fixed individually to the base in the slit forming process. Therefore, the strength of the multilayer piezoelectric elements is reduced unavoidably.

Therefore, in a second mode, a shoulder is formed in a surface of the base, and the first nondriven layer of the multilayer piezoelectric block is formed with a thickness greater than the height of the shoulder in the base. In the multilayer piezoelectric block bonding process, the first nondriven layer of the multilayer piezoelectric block is bonded to a recessed section of a surface of the base so as to be in contact with the shoulder.

Subsequently, an electrode film is formed so as to cover at least exposed portions of the front and the back end surface of the multilayer piezoelectric block and the surfaces of a raised section of the upper surface of the base. In the slit forming process, slits are formed with a depth extending from the surface of the second nondriven layer of the multilayer piezoelectric block to the middle of the first nondriven layer so as to extend to the raised section of the upper surface of the base. Thus, the electrode film formed on the raised section of the upper surface of the base forms a driving collecting electrode electrically connected to the electrode film formed on the back surface of the multilayer piezoelectric block, and the electrode film formed on the front end surface of the multilayer piezoelectric block forms a common collecting electrode.

Consequently, the multilayer piezoelectric elements are interconnected by the first nondriven layer and hence the multilayer piezoelectric elements have a strength higher than that of the multilayer piezoelectric elements formed in the first mode.

In a third mode, a shoulder is formed in a surface of the base, and the first nondriven layer of the multilayer piezoelectric block is formed with a thickness greater than the height of the shoulder in the base. In the multilayer piezoelectric block bonding process, the first nondriven layer of the multilayer piezoelectric block is bonded to a recessed section of the surface of the base so as to be in contact with the shoulder.

Subsequently, a portion of any width of the back portion of the multilayer piezoelectric block and extending from a position included in a plane flush with the surface of the raised section of the upper surface of the base is cut off. Then, an electrode film is formed at least over the front end surface of the multilayer piezoelectric block, the cut surface of the multilayer piezoelectric block and the raised section of the upper surface of the base. Consequently, since the boundary between the multilayer piezoelectric block, and the raised section of the upper surface of the base is shifted from a corner to a flat surface, an adhesive which is squeezed out through the boundary can easily be wiped off. Therefore, a uniform electrode film can be formed thereon.

In the slit forming process, slits are formed so as to extend to the raised section of the upper surface of the base, so that the electrode film formed on the raised section of the upper surface of the base forms a driving collecting electrodes electrically connected to the electrode film formed on the cut surface of the multilayer piezoelectric block, and the electrode film formed on the front end surface of the multilayer piezoelectric block forms a common collecting electrode.

BEST MODE FOR CARRYING OUT THE INVENTION

Preferred embodiments of the present invention will be described with reference to the accompanying drawings.

Figure 1:
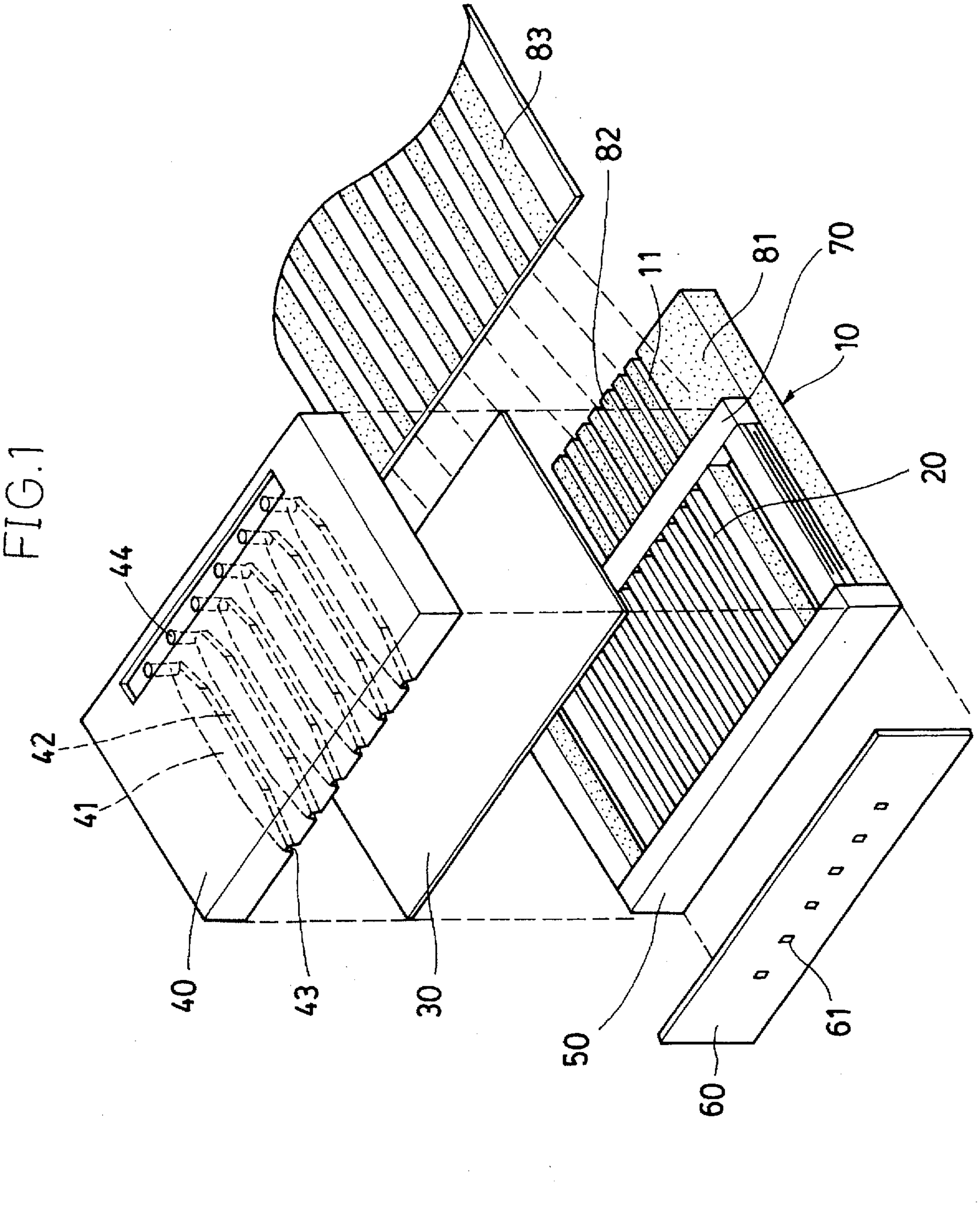
FIG. 1 is an exploded perspective view of an ink-jet head in a first embodiment according to the present invention.

An ink-jet head in a first embodiment according to the present invention will be described with reference to FIGS. 1 to 3.

The ink-jet head in the first embodiment comprises a base 10, a plurality of multilayer piezoelectric elements 20, an oscillation plate 30, a flow passage plate 40, a front member 50, a nozzle plate 60 and a back member 70.

The base 10 is made of a rigid, insulating material, such as a ceramic material. The base 10 in this embodiment has the shape of a rectangular block.

The plurality of multilayer piezoelectric elements 20 have the shape of a rectangular bar. As shown in FIG. 2, each multilayer piezoelectric element 20 is formed by alternately stacking first piezoelectric plates 21 polarized in the direction of the thickness and second piezoelectric plates 22 polarized in the opposite direction. First conductive members 23 and second conductive members 24 are interposed alternately between the piezoelectric plates 21 and 22.

The front edges of the first conductive members 23 are extended to the front end surface (the left end surface as viewed in FIG. 2) of each multilayer piezoelectric element 20 and the back edges of the same are at any distance inward from the back end surface (the right end surface as viewed in FIG. 2) of each multilayer piezoelectric element 20. The back edges of the second conductive members 24 are extended to the back end surface of each multilayer piezoelectric element 20 and the front edges of the same are at any distance inward from the front end surface of the multilayer piezoelectric element 20.

The lowermost layer 25 and the uppermost layer 26 of each multilayer piezoelectric element 20 are not sandwiched between the conductive members 23 and 24. Therefore, no potential difference will be created between the upper and the lower surface when a voltage is applied across the conductive members 23 and 24, and hence the lowermost layer 25 and the uppermost layer 26 are not distorted. Thus, the lowermost layer 25 and the uppermost layer 26 serve as a first and a second nondriven layer which are not distorted.

The multilayer piezoelectric elements 20 are arranged at fixed intervals on the base 10, and the lower surfaces of the lowermost layers (the first nondriven layers) 25 are bonded to the upper surface of the base 10. The front end surfaces of the multilayer piezoelectric elements 20 are flush with the front end surface of the base 10. The length of the multilayer piezoelectric elements 20 is smaller than that of the base 10. Therefore, the back portion of the upper surface of the base 10 has an exposed back portion to which the multilayer piezoelectric elements 20 are not bonded.

Figure 3:
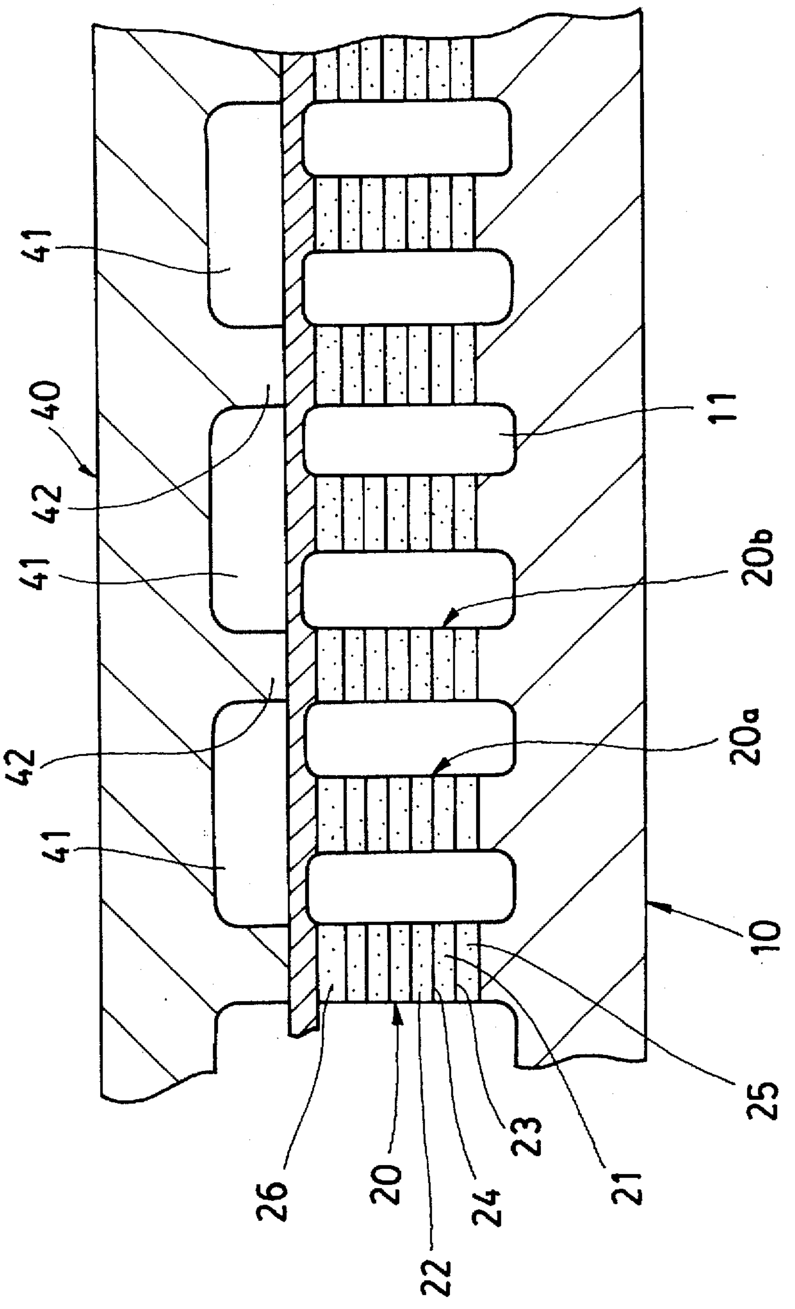
FIG. 3 is an enlarged, fragmentary, sectional front view of the inkjet head in the first embodiment according to the present invention.

As shown in FIG. 3, longitudinal grooves 11 of any certain depth are formed in portions of the upper surface of the base 10 between the multilayer piezoelectric elements 20. The grooves 11 extend from the spaces between the multilayer piezoelectric elements 20 to the back end of the base 10.

A continuous electrode film is formed over the front end surfaces of the multilayer piezoelectric elements 20, the front end surface of the base 10, the opposite side surfaces of the base 10 and the opposite side edge portions of the back portion of the upper surface of the base 10. This electrode film serves as a grounding common collecting electrode 81. The common collecting electrode 81 is connected electrically to the first conductive members 23 on the front end surfaces of the multilayer piezoelectric elements 20.

A continuous electrode film is formed over the back end surfaces of the multilayer piezoelectric elements 20 and a back portions of the upper surface of the base 10 split by the grooves. This electrode film serves as a driving collecting electrode 82. The driving collecting electrode 82 is connected electrically to the second conductive members 24 on the back end surfaces of the multilayer piezoelectric elements 20.

The common collecting electrode 81 and the driving collecting electrode 82 thus formed can collectively be connected to external signal lines in a back portion of the base 10, and hence wiring is simplified and made easier.

When a voltage is applied across the common collecting electrode 81 and the driving collecting electrode 82, a potential difference is created between the conductive members 23 and 24, and an electric field is created in the direction of thickness of the piezoelectric plates 21 and 22. Consequently, the piezoelectric plates 21 and 22 sandwiched between the conductive members 23 and 24 are distorted in the direction of the thickness.

The front member 50 is bonded to the base 10 and the front end surfaces of the piezoelectric elements 20, on which the common collecting electrode 81 is formed, of the base 10 and the multilayer piezoelectric elements 20. The front member 50 is a made of a rigid material, such as a ceramic material, with a large thickness. The front member 50 serves as a support member for supporting the front ends of the multilayer piezoelectric elements 20.

The back member 70 made of a rigid insulating material is bonded to portions of a back section of the upper surface of the base 10 and the rear end surfaces of the multilayer piezoelectric elements 20, on which the driving collecting electrode 82 is formed. The back member 70 has a large thickness and serves as a support member for supporting the back ends of the multilayer piezoelectric elements 20.

The respective upper surfaces of the front member 50 and the back member 70 are flush with the upper surfaces of the multilayer piezoelectric elements 20.

One of the flat surfaces of the thin, metallic oscillation plate 30 of several tens micrometers in thickness is bonded to each of the upper surfaces of the multilayer piezoelectric elements 20, the front member 50 and the back member 70. When a pressure resulting from the distortion of the multilayer piezoelectric elements 20 in the direction of the thickness acts on the oscillation plate 30, the oscillation plate 30 bends in the direction of action of the pressure.

The flow passage plate 40 is provided with a plurality of ink chambers 41 arranged in the direction of the width of the flow passage plate 40. The ink chambers 41 are spaced by partition walls 42. The distance between the respective center axes of the partition wall 42 and the ink chamber 41 is substantially equal to the pitch of the center axes of the multilayer piezoelectric elements 20.

As shown in FIG. 3, the alternate multilayer piezoelectric elements 20 serve as driving multilayer piezoelectric elements **20*a* to which voltage is applied, and the multilayer piezoelectric elements 20 at the opposite ends with respect to the width and those between the driving multilayer piezoelectric elements 20*a* serve as supporting multilayer piezoelectric elements 20*b*** to which voltage is not applied.

The end surfaces of the partition walls 42 of the flow passage plate 40 are bonded to the oscillation plate 30 with the partition walls 42 opposite the supporting multilayer piezoelectric elements **20*b*, and the ink chambers 41 opposite the driving multilayer piezoelectric elements 20*a*. A plurality of ink outlets 43 are formed in the front end of the flow passage plate 40 so as to be connected to the ink chambers 41, respectively. A plurality of ink inlets 44 are formed in the back portion of the flow passage plate 40 so as to be connected to the ink chambers 44**.

The front member 50 has a flat front surface. The front surface of the front member 50, the front end of the oscillation plate 30 and the front end of the flow passage plate 40 are flush with each other. The nozzle plate 60 is bonded to the front surface of the front member 50, the front end of the oscillation plate 30 and the front end of the flow passage plate 40. The nozzle plate 60 is provided with a plurality of nozzle holes 61. The nozzle holes 61 are connected to the ink outlets 43 of the flow passage plate 40.

Since the nozzle plate 60 is supported not only by the flow passage plate 40 but also by the front member 50, the pressure applied by a cap or a cleaning blade (refer to JP-A No. 4-77669) to the front surface of the nozzle plate 60 is sustained by both the flow passage plate 40 and the front member 50. Therefore, there is no possibility that the flow passage plate 40 is distorted.

Figure 2:
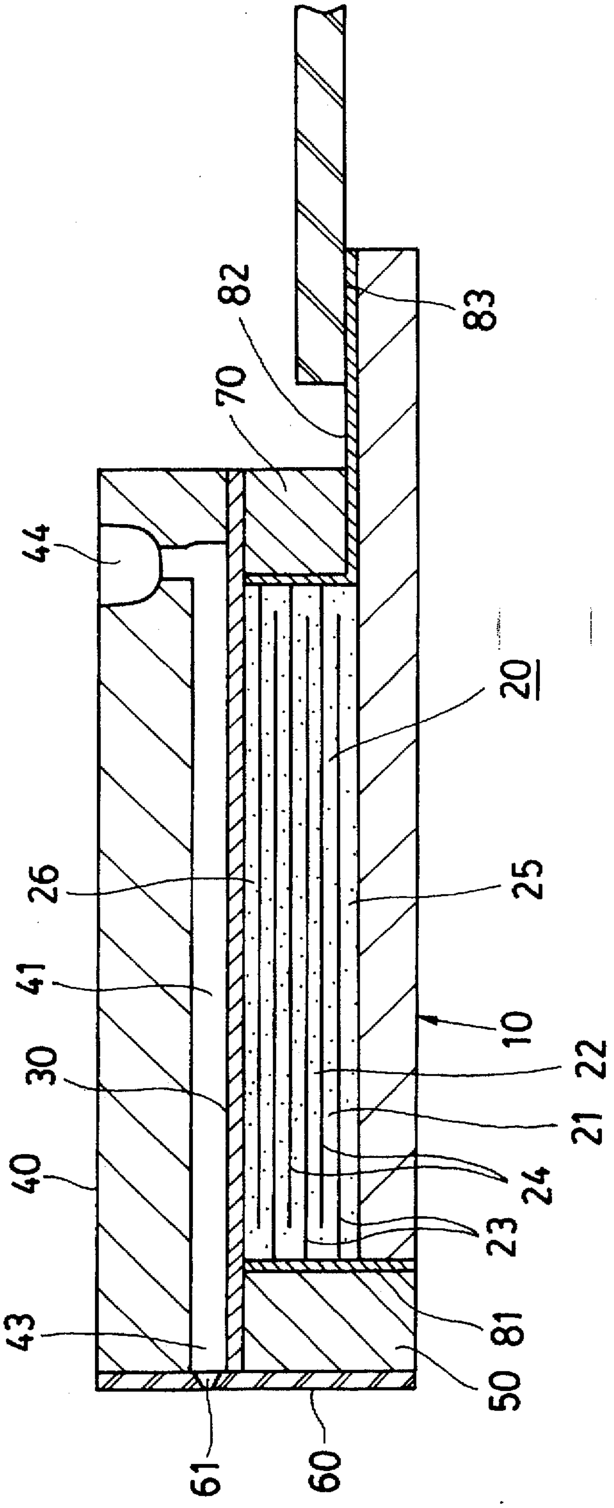
FIG. 2 is a sectional side view of the ink-jet head in the first embodiment according to the present invention.

In the ink-jet head thus constructed, the front member 50 is bonded to the front end surfaces of the multilayer piezoelectric elements 20, and the oscillation plate 30 is bonded to the upper end surface of the front member 50 as shown in FIG. 2. Therefore, the multilayer piezoelectric elements 20 are not wetted by the ink leaked through the nozzle holes 61 and hence there is no possibility that the conductive members 23 and 24 of the multilayer piezoelectric elements 20 are short-circuited.

The operation of the ink-jet head in the first embodiment will be described hereinafter.

Referring to FIG. 2, external wires 83 are connected to the common collecting electrode 81 and the driving collecting electrode 82 from behind and fixed power is supplied. Then, a potential difference is created between the first conductive members 23 and the second conductive members 24 and thereby an electric field is applied across the first piezoelectric plates 21 and the second piezoelectric plates 22 in the direction of the thickness.

Since the piezoelectric plates 21 and 22 are polarized in the direction of the thickness, i.e., in the direction of the electric field, the piezoelectric plates 21 and 22 expand in the direction of the thickness.

A strain developed in each piezoelectric plate is proportional to field intensity and is expressed by:

$$\delta_r/t = d_{33} \times V/t$$

therefore, $$\delta_r = d_{33} V$$

where t is the thickness of the piezoelectric plate, $\delta_r$ is strain, V is applied voltage and $d_{33}$ is piezoelectric constant with respect to the direction of the thickness.

The strain has a very small value generally less than 1 μm. Since the multilayer piezoelectric element 20 is formed by stacking a plurality of piezoelectric plates, the displacement increases in proportion to the number of the stacked piezoelectric plates as described before.

As shown in FIGS. 2 and 3, the bottoms of the multilayer piezoelectric elements 20 are supported on the base 10, and the rigid front member 50, the rigid back member 70 and the supporting multilayer piezoelectric elements **20*b* form a support structure for supporting the multilayer piezoelectric elements 20. Therefore, the multilayer piezoelectric elements 20 are distorted toward the ink chambers 41 of the flow passage plate 40 not bound by the support structure. Consequently, the ink filling up the ink chambers 41 can efficiently be jetted out in ink particles through the nozzle holes 61**.

Since a portion of the oscillation plate 30 near the ink outlets 43 are fixed to the front member 50, portions around the ink outlets 43 formed by the flow passage plate 40 and the oscillation plate 30 do not oscillate. Therefore, the sectional area of the ink outlets 43 is not changed by the oscillation of the oscillation plate 30 when forming ink particles and hence there is no possibility that ink particles are broken up or atomized by oscillations.

The base 10 needs only a thickness enough to withstand a reaction force exerted thereon by one multilayer piezoelectric element 20 and hence may be small and lightweight.

Since the supporting multilayer piezoelectric element **20*b* is interposed between the adjacent driving multilayer piezoelectric elements 20*a*, and the oscillation plate 30 is fixed between the upper ends of the supporting multilayer piezoelectric elements 20*b* and the partition walls 42 of the flow passage plate 40, the oscillations of portions of the oscillation plate 30 caused by the driving multilayer piezoelectric elements 20*a*** do not interfere with each other.

As another result, as shown in FIG. 2, since the uppermost layers 26 of the multilayer piezoelectric elements 20 are the second nondriven layers which are not distorted, any strain of the $d_{31}$ mode does not develop in the surfaces of the multilayer piezoelectric elements 20 in contact with the oscillation plate 30. Therefore, the reduction of the volume changing efficiency of the ink chambers 41 due to the composite effect of the strains of the driving multilayer piezoelectric elements 20*a* in the $d_{33}$ mode and the unimorphic distortion of the contact surfaces of the oscillation plate 30 in the $d_{31}$ mode does not occur.

A method of manufacturing the ink-jet head in the first embodiment will be described in order of sequential processes with reference to FIGS. 4 to 8.

Multilayer Piezoelectric Block Bonding Process

Figure 4:
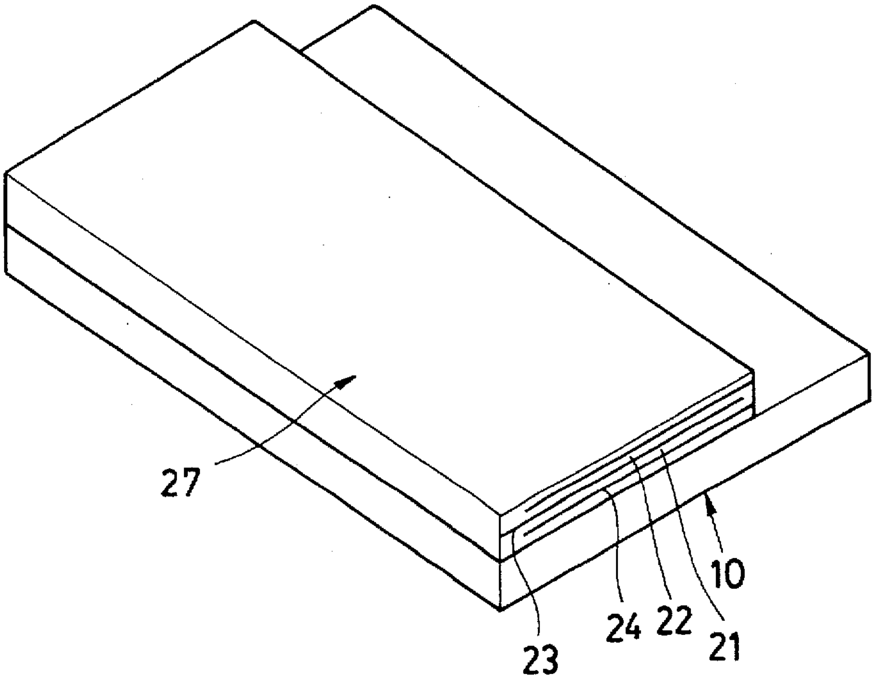
FIG. 4 is a perspective view of assistance in explaining a method of manufacturing the ink-jet head in the first embodiment according to the present invention.

Referring to FIG. 4, the first piezoelectric plates 21 and the second piezoelectric plates 22 made of a piezoelectric ceramic material, etc., are stacked alternately with the first conductive members 23 and the second conductive members 24 sandwiched between the adjacent piezoelectric plates 22 and 23 to form a multilayer piezoelectric block 27. The front edges of the first conductive members 23 are exposed in the front end surface of each multilayer piezoelectric element 20 and the back edges of the same are at any distance inward from the back end surface of each multilayer piezoelectric element 20. The back edges of the second conductive members 24 are exposed in the back end surface of each multilayer piezoelectric element 20 and the front edges of the same are at any distance inward from the front end surface of the multilayer piezoelectric element 20. The lowermost layer 25 and the uppermost layer 26 are the first and the second nondriven layers.

Preferably, the thickness of the uppermost layer (the second nondriven layer) 26 of the multilayer piezoelectric block 27 is slightly greater than those of the first piezoelectric plates 21 and the second piezoelectric plates 22. For example, when the thickness of the first piezoelectric plates 21 and the second piezoelectric plates 22 positioned at the intermediate portion is about 20 μm, the thickness of the uppermost layer 26 is about 50 μm. When the uppermost layer 26 is formed in such an increased thickness, a grinding allowance can be secured and the uppermost layer 26 serves as a buffer layer during grinding to prevent damaging the first conductive members 23 and the second conductive members 24, etc.

The lowermost layer (the first nondriven layer) 25 is bonded to the upper surface of the base 10 with the front end of the multilayer piezoelectric block 27 flush with the front end of the base 10. The front end surface of the multilayer piezoelectric block 27 and the front end surface of the base 10 are subjected simultaneously to surface grinding to secure the flatness of the front end surfaces.

Figure 5:
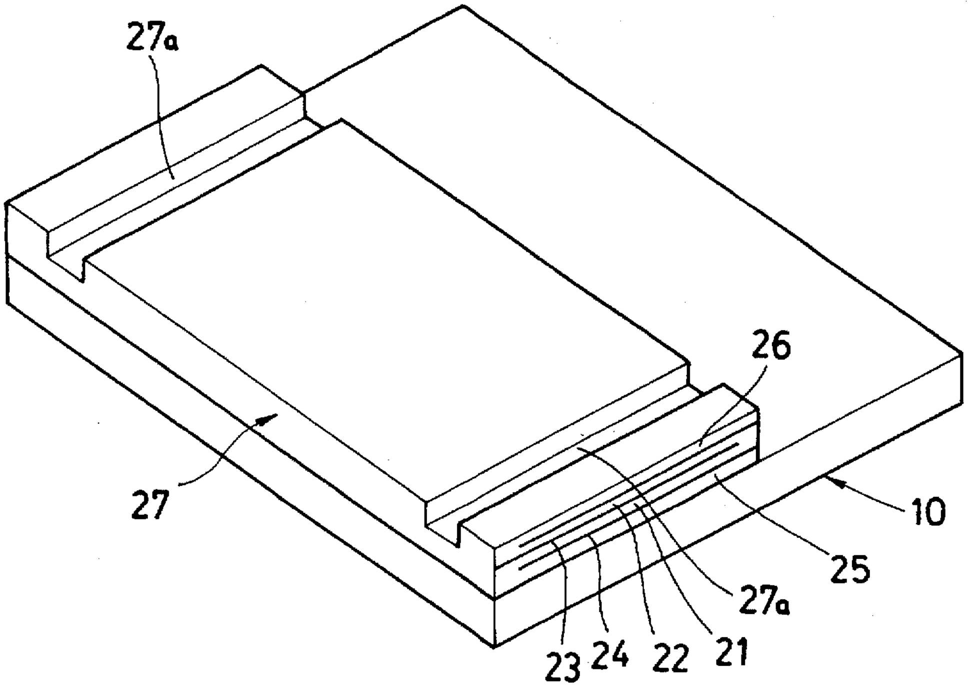
FIG. 5 is a perspective view of assistance in further explaining the method of manufacturing the ink-jet head in the first embodiment according to the present invention, described in connection with FIG. 4.

As shown in FIG. 5, longitudinal grooves 27*a* are formed in the upper surface of the multilayer piezoelectric block 27 at any distance from the opposite side edges of the same upper surface. The grooves 27*a* may be formed by a machining process using a diamond blade. The grooves 27*a* have any depth from the upper surface to the middle portion of the multilayer piezoelectric block 27.

Electrode Film Forming Process

Figure 6:
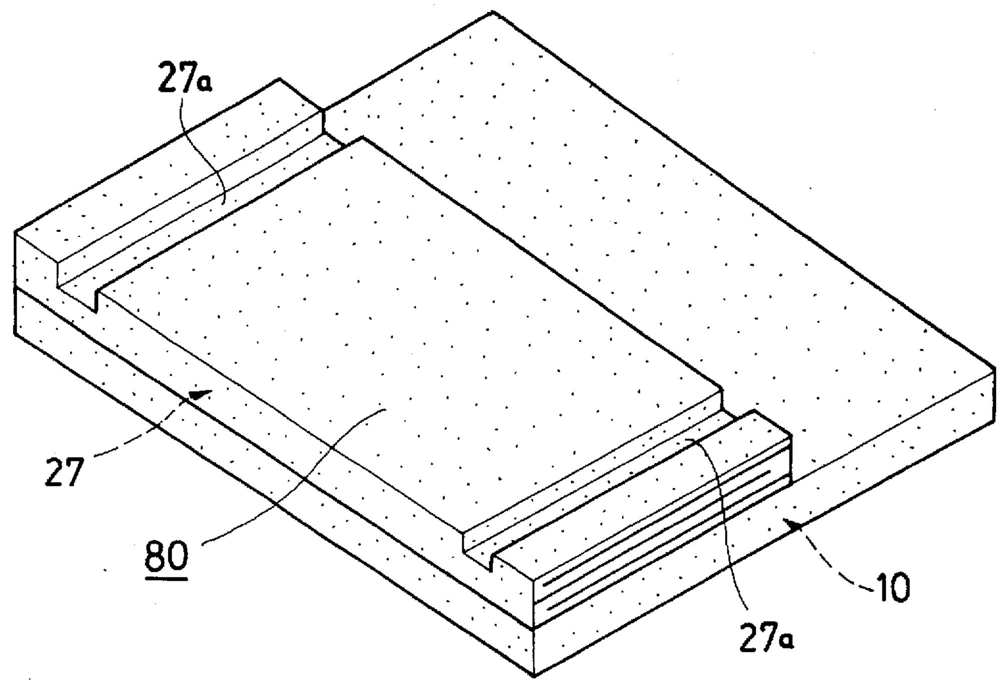
FIG. 6 is a perspective view of assistance in further explaining the method of manufacturing the ink-jet head in the first embodiment according to the present invention, described in connection with FIG. 5.

Subsequently, the electrode film 80 of a conductive material, such as Au, is formed over the entire surface of the base 10 excluding the bottom surface, and the entire surface of the multilayer piezoelectric block 27 by a thin film forming means, such as a vacuum evaporation process or the like as shown in FIG. 6.

Slit Forming Process

Figure 7:
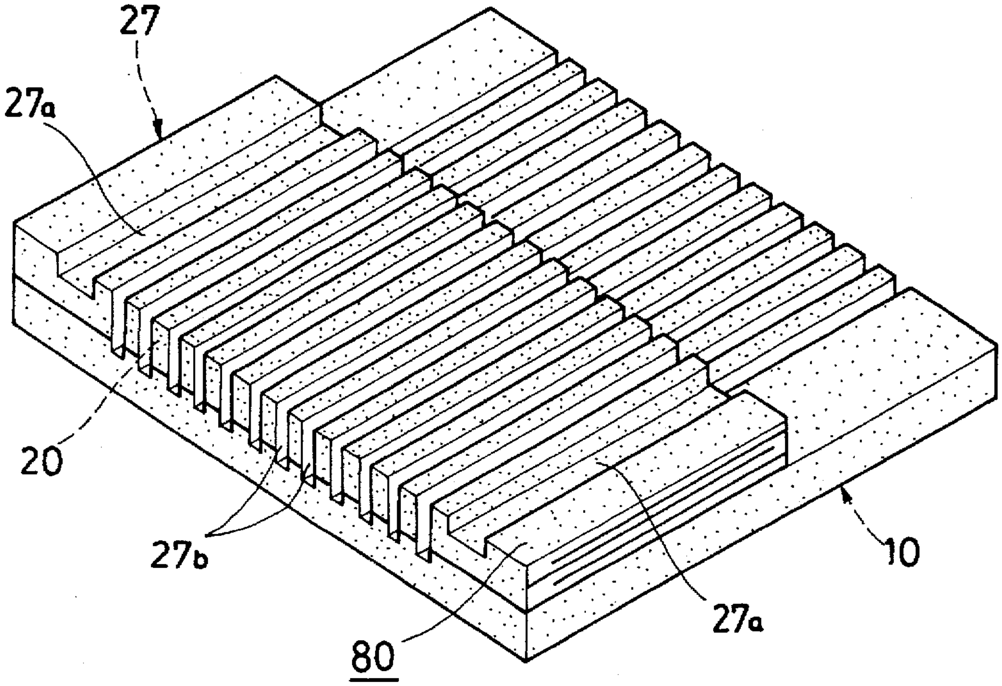
FIG. 7 is a perspective view of assistance in further explaining the method of manufacturing the ink-jet head in the first embodiment according to the present invention, described in connection with FIG. 6.

Then, as shown in FIG. 7, a plurality of longitudinal slits 27*b* of a depth from the upper surface of the multilayer piezoelectric block 27 to a middle portion of the base 10 are formed by a machining process using a diamond blade or a wire saw. The slits 27*b* extend from the front end to the back end of the base 10 and are arranged transversely at fixed intervals. Thus, the multilayer piezoelectric block 27 is split by the slits 27*b* into the plurality of multilayer piezoelectric elements 20.

Front and Back Member Bonding Process

Figure 8:
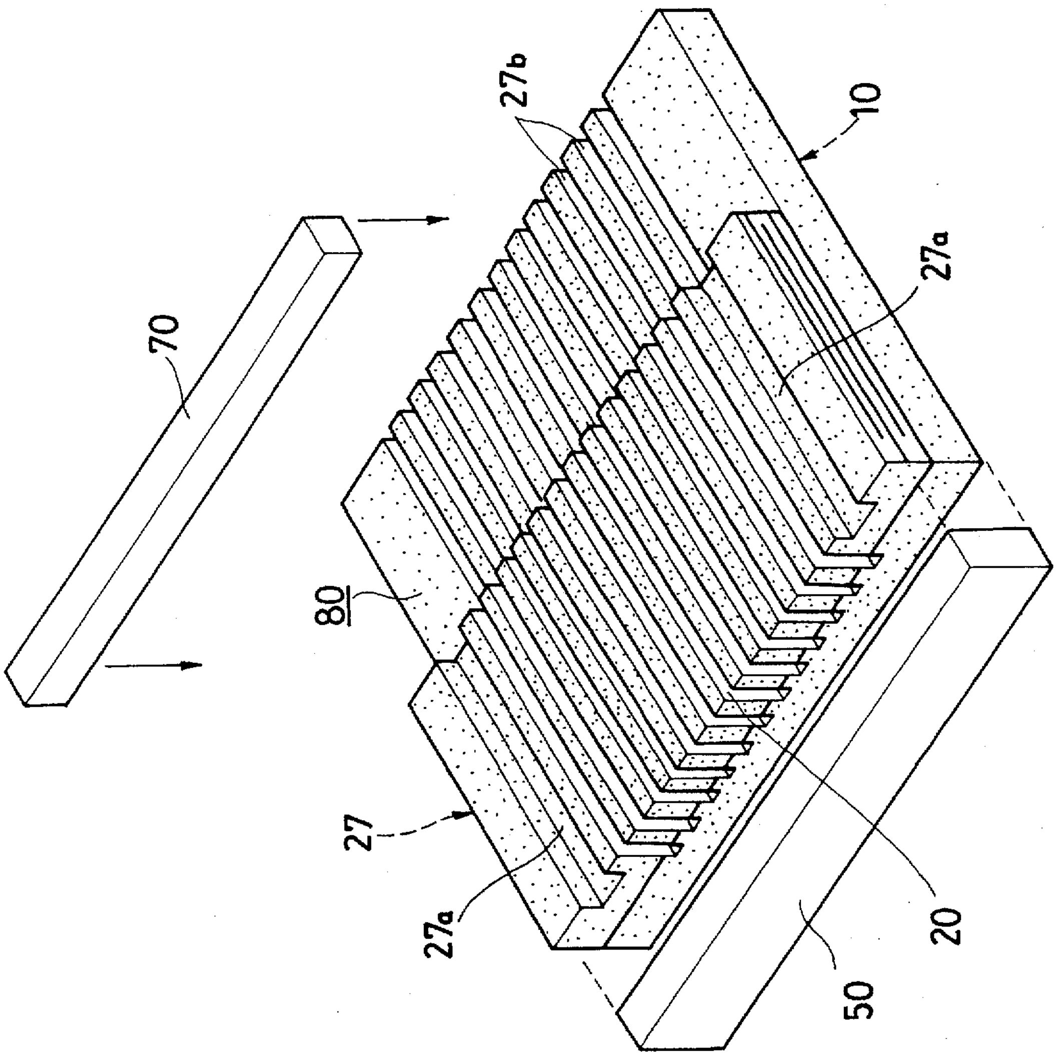
FIG. 8 is a perspective view of assistance in further explaining the method of manufacturing the ink-jet head in the first embodiment according to the present invention, described in connection with FIG. 7.

Then, as shown in FIG. 8, the relatively thick front member 50 made of a rigid material, such as a ceramic material, is bonded to the front end surfaces of the base 10 and the multilayer piezoelectric elements 20. The relatively thick back member 70 made of a rigid material, such as a ceramic material, is bonded to the back end surfaces of the multilayer piezoelectric elements 20, and the lower surface of the back member 70 is bonded to the upper surface of the base 10. Since a portion of the electrode film 80 formed over the front end surfaces of the base 10 and the multilayer piezoelectric elements 20 is used as the common collecting electrode 81, the front member 50 in contact with this portion of the electrode film 80 may be formed of a conductive material. However, the back member 70 in contact with a portion of the electrode film 80 formed on the back portion of the upper surface of the base 10 and the back end surfaces of the multilayer piezoelectric elements 20 is formed of an insulating material because the same portion of the electrode film 80 is used as the driving collecting electrode 82.

Oscillation Plate Bonding Process

Subsequently, the uppermost layers (the second nondriven layers) 26 of the multilayer piezoelectric elements 20, the upper surface of the front member 50 and the upper surface of the back member 70 are subjected simultaneously to a surface grinding process to finish those surfaces flush with each other. Portions of the electrode film 80 formed on the upper surfaces of the multilayer piezoelectric elements 20 are ground off. Consequently, portions of the electrode film 80 remain only on the front end surfaces of the multilayer piezoelectric elements 20, the front end surface of the base 10, the opposite side surfaces of the base 10, the back end surfaces of the multilayer piezoelectric elements 20 and the back portion of the upper surface of the base 10.

Portions of the electrode film 80 formed on the front end surfaces of the multilayer piezoelectric elements 20, the surfaces of the grooves 27*a*, the front end surface of the base 10, the opposite side surfaces of the base 10 and opposite side portions of the back portion of the upper surface of the base 10 are electrically continuous, and these portions of the electrode film 80 are used as the common collecting electrode 81. Portions of the electrode film 80 formed on the back end surfaces of the multilayer piezoelectric elements 20 spaced by the slits 27*b*, and the back portion of the upper surface of the base 10 are individually electrically continuous, and those portions of the electrode film 80 are used as the driving collecting electrode 82. A portion of the electrode film 80 formed on the back end surface of the base 10 is removed by surface grinding.

The oscillation plate 30 is bonded to the upper surfaces of the multilayer piezoelectric elements 20 and the upper surfaces of the front member 50 and the back member 70 finished flush with each other.

Flow Passage Plate Bonding Process

Subsequently, the flow passage plate 40 is prepared and is disposed on the oscillation plate 30 with its partition walls 42 positioned opposite to the alternate multilayer piezoelectric elements 20, i.e., the supporting multilayer piezoelectric elements **20*b*. In this state, the ink chambers 41 of the flow passage plate 40 are positioned on the oscillation plate 30 opposite to the multilayer piezoelectric elements 20 contiguous with the supporting multilayer piezoelectric elements 20*b*, i.e., the driving multilayer piezoelectric elements 20*a*. Preferably, the ink outlets 43 of the flow passage plate 40 are substantially flush with the front surface of the front member 50**.

The partition walls 42 of the flow passage plate 40 thus disposed are bonded to the oscillation plate 30.

Nozzle Plate Bonding Process

The front surface of the front member 50 and the front ends of the oscillation plate 30 and the flow passage plate 40 are subjected simultaneously to surface grinding to finish the front surface of the front member 50 and the front ends of the oscillation plate 30 and the flow passage plate 40 with a surface roughness of about 1 μm, and then the nozzle plate 60 is bonded to the front surface of the front member 50 and the front ends of the oscillation plate 30 and the flow passage plate 40 so that the nozzle holes 61 of the nozzle plate 60 coincide with the ink outlets 43.

Finally, the external wires 83 are connected to the driving collecting electrode 82 in contact with the driving multilayer piezoelectric elements **20*a* and the common collecting electrode 81 on the back portion of the upper surface of the base 10**.

Since this manufacturing method grinds simultaneously the upper surfaces of the multilayer piezoelectric elements 20, the front member 50 and the back member 70 flush by a surface grinding process, the oscillation plate 30 can closely be bonded to those upper surfaces. Consequently, pressure developed by the distortion of the driving multilayer piezoelectric elements **20*a* can surely be transmitted to the oscillation plate 30**.

Since the front surface of the front member 50 and the end surfaces of the oscillation plate 30 and the flow passage plate 40, to which the nozzle plate 60 is bonded, are ground simultaneously to a surface roughness of about 1 (m, no bubble remains between the nozzle plate 60 and the front surface of the front member 50 and the end surfaces of the oscillation plate 30 and the flow passage plate 40 when the nozzle plate 60 is bonded to the front surface of the front member 50 and the end surfaces of the oscillation plate 30 and the flow passage plate 40. Therefore, the nozzle holes 61 can surely be connected to the ink outlets 43 and faulty ink jetting operation can be prevented.

Since electrical leakage between the first conductive members 23 and the second conductive members 24, which serve as opposed electrodes, formed on the inner walls of the slits **27*b* by the slit forming process can be shielded from the atmosphere by the front member 50 and the back member 70, there is no possibility that the ink leaked through the nozzle holes 61 and moisture contained in air adhere to the electrode film 80** and there is no danger of short circuit, etc.

The common collecting electrode 81 and the driving collecting electrode 82 can easily be formed by forming the electrode film 80 on the base 10 and the multilayer piezoelectric elements 20 by a thin film forming means, such as a vacuum evaporation process for depositing an Au film, and patterning the electrode film 80 by a surface grinding process and a slitting process.

When the insulating base 10 is made of a material having a small dielectric constant, the base 10 does not undergo dielectric polarization. Therefore, the electric capacity of each driving multilayer piezoelectric element **20*a*** is stabilized and ink jetting characteristics do not vary widely.

Figure 9:
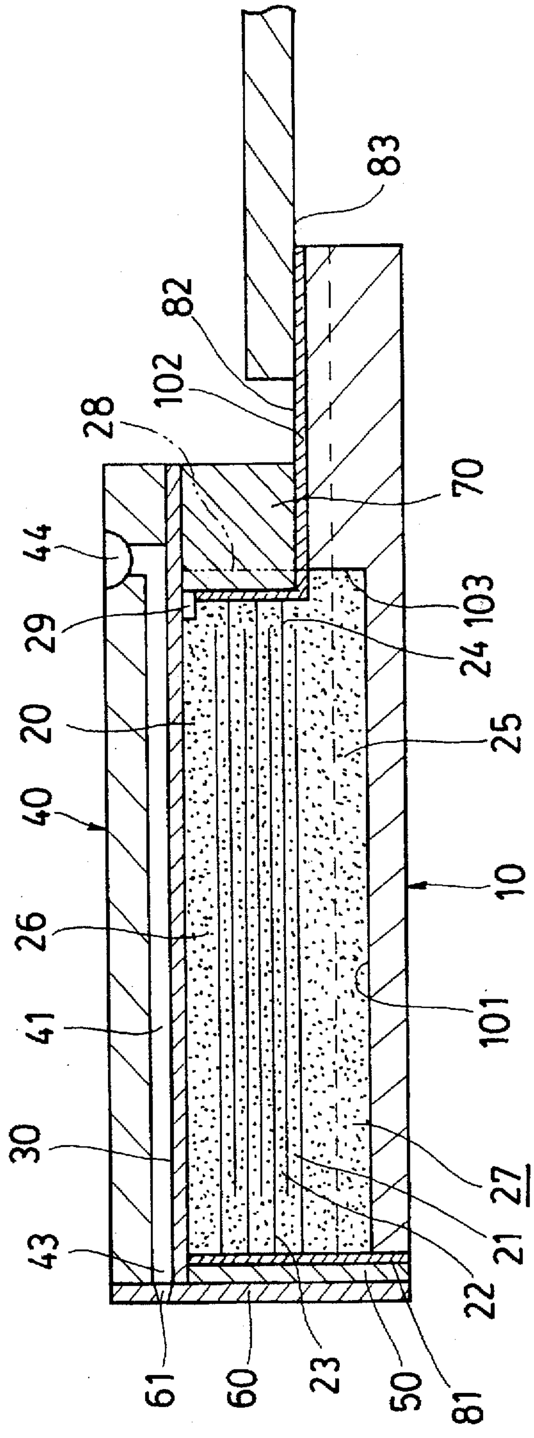
FIG. 9 is a sectional side view of an ink-jet head in a second embodiment according to the present invention.
Figure 10:
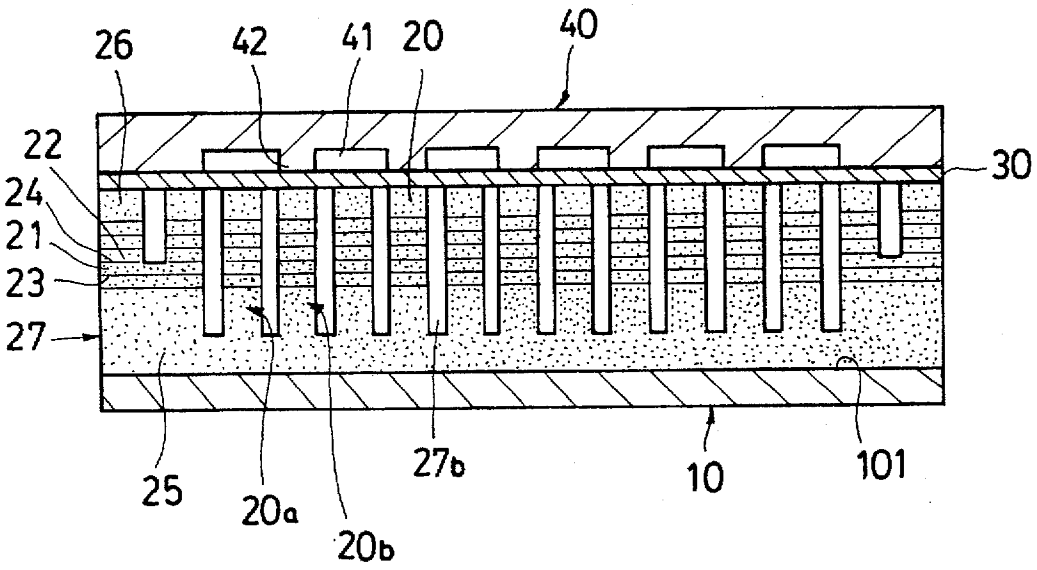
FIG. 10 is a sectional front view of the ink-jet head in the second embodiment according to the present invention.
Figure 11:
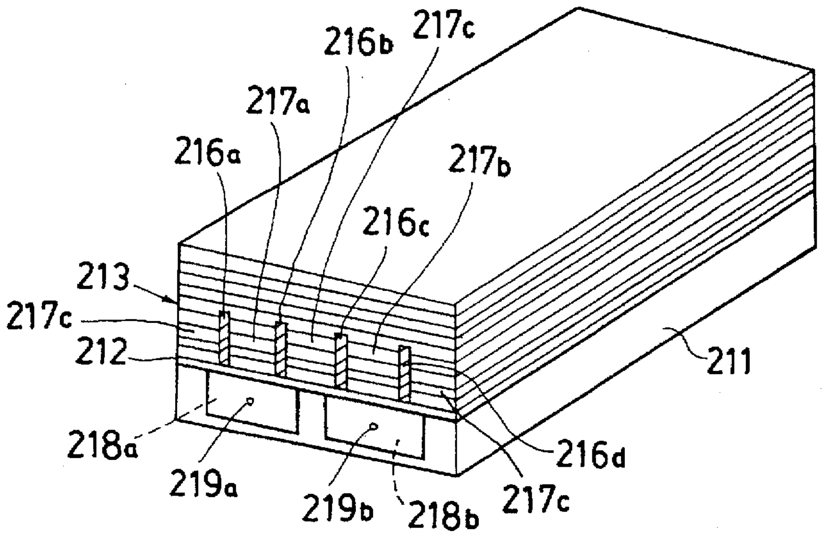
FIG.11 PRIOR ART
FIG. 11 is a perspective view of a prior art ink-jet head.
Figure 12:
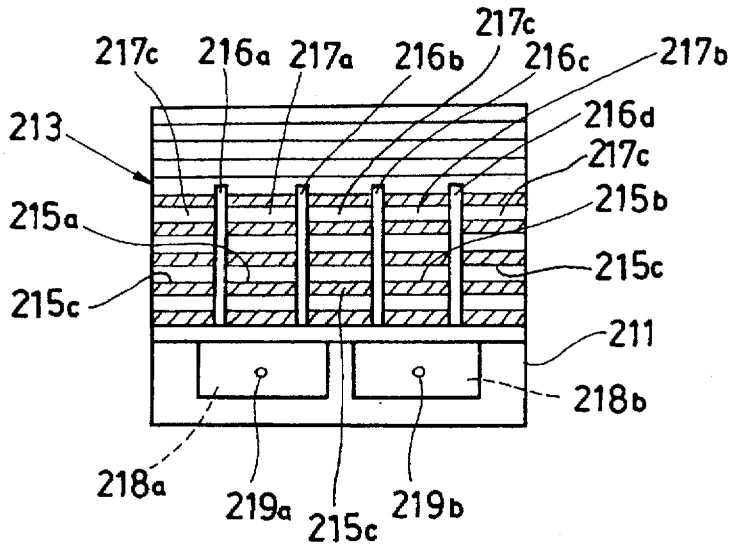
FIG. 12 PRIOR ART
FIG. 12 is a sectional front view of the prior art ink-jet head of FIG. 11.

An ink-jet head in a second embodiment according to the present invention will be described with reference to FIGS. 9 and 10, in which parts like or corresponding to those of the ink-jet head in the first embodiment are designated by the same reference characters and the description thereof will be omitted.

An ink-jet head in the second embodiment has a base 10 having a stepped upper surface consisting of a recessed front section 101 and a raised back section. A multilayer piezoelectric block 27 is bonded to the recessed section 101 of the upper surface of the base 10, and a lower portion of the back end of the multilayer piezoelectric block 27 is bonded to a shoulder 103 formed on the upper surface of the base 10.

The thickness of the lowermost layer (a first nondriven layer) 25 of the multilayer piezoelectric block 27 is greater than the height of the shoulder in the base 10. Slits **27*b* are formed in the multilayer piezoelectric block 27 with a depth from the upper surface to the middle portion of the lowermost layer (the first nondriven layer) 25 of the multilayer piezoelectric block 27 to form a plurality of multilayer piezoelectric elements 20 transversely arranged at fixed intervals as shown in FIG. 10. The slits 27*b* extend continuously through the multilayer piezoelectric block 27 to the back end of the base 10**.

A front member 50 is relatively thin. Although the front member 50 of the first embodiment is relatively thick, the front member 50 is strong enough to serve as a support member for preventing the deformation of the multilayer piezoelectric elements 20 even if the front member 50 is a relatively thin member having a thickness in the range of 0.1 to 1 mm, because a plate is strong against a longitudinal load and is capable of withstanding a buckling load when bonded to a nozzle plate 60.

When the front member 50 is relatively thin, the distance between ink chambers 41, whose volume is changed by pressure exerted thereon by the multilayer piezoelectric elements 20, and the nozzle holes 61 is relatively short and, consequently, a change in the volume of the ink chamber 41 can be transmitted to corresponding ink in the nozzle hole 61 without loss for efficiently producing ink particles.

The ink-jet head in the second embodiment can be manufactured by a method developed by incorporating additional processes and changes in the method of manufacturing the ink-jet head in the first embodiment. The additional processes and changes will be described hereinafter.

The base 10 is formed in a stepped shape having an upper surface having a recessed front section 101 and a raised back section 102. The lowermost layer (the first nondriven layer) 25 of the multilayer piezoelectric block 27 is formed with a thickness greater than those of first piezoelectric plates 21 and second piezoelectric plates 22 positioned in the middle portion. For example, the thicknesses of the first piezoelectric plates 21 and the second piezoelectric plates 22 are about 20 μm and the thickness of the lowermost layer 25 is in the range of about 100 to 200 μm. The thickness of the lowermost layer 25 of the multilayer piezoelectric block 27 is greater than the height of the shoulder 103 of the base 10.

In a multilayer piezoelectric block bonding process, the lowermost layer 25 of the multilayer piezoelectric block 27 is bonded to the recessed front section 101 of the upper surface of the base 10 with the back end surface of the lowermost layer 25 bonded to the shoulder 103 in the base 10.

Then, a back end portion 28 (indicated by imaginary lines in FIG. 9) of any width of the multilayer piezoelectric block 27 is cut off with a cutting tool, such as a diamond blade so that the upper surface of the remaining portion of the back end portion is flush with the surface of the raised back section 102 of the upper surface of the base 10. Consequently, the shoulder 103 of the base 10 and a lower portion of the back end surface of the multilayer piezoelectric block 27 to be bonded lie in a plane. Therefore, an adhesive squeezed out of the bond can easily and surely be wiped off and the peeling of an electrode film 80 formed thereon can be prevented. Since the bond tends to warp longitudinally when the multilayer piezoelectric element 20 is distorted in the direction of the thickness, a tensile or compressive stress is induced in the electrode film 80 but any shearing stress is not induced therein. Therefore, there is no possibility that the electrode film 80 is broken.

When the electrode film 80 is formed after thus cutting off the back end portion 28 of the multilayer piezoelectric block 27, the electrode film 80 is formed on the cut surface of the multilayer piezoelectric block 27.

A slit forming process forms the plurality of slits **27*b* in the multilayer piezoelectric block 27 with a depth from the upper surface to the middle portion of the lowermost layer (the first nondriven layer) 25 of the multilayer piezoelectric block 27. The slits 27*b* extend from the back end of the multilayer piezoelectric block 27 to the back end of the raised section 102 of the base 10. Thus, the plurality of parallel multilayer piezoelectric elements 20 spaced by the slits 27*b* are formed in the multilayer piezoelectric block 27. A portion of the electrode film 80 formed on the back end surfaces (cut surfaces) of the multilayer piezoelectric elements 20 and the back portion of the upper surface of the base 10 serves as the driving collecting electrode 82**.

The present invention is not limited to the foregoing embodiments.

For example, when the oscillation plate 30 is conductive, there is the possibility that the common collecting electrode 81 and the driving collecting electrode 82 are connected electrically through the oscillation plate 30. In such a case, for example, the oscillation plate 30 must be isolated from the driving collecting electrode 82 by cutting upper edge portions of the back ends of the multilayer piezoelectric elements 20 to form recesses 29 (refer to FIG. 9) so that portions of the electrode film 80 (driving collecting electrode 82) formed on the upper edge portions are removed together with the upper edge portions.

The supporting multilayer piezoelectric elements **20*b* are not connected to the external wires 83 in the foregoing embodiments, however, the supporting multilayer piezoelectric elements 20*b* may be connected to the external wires 83 when the supporting multilayer piezoelectric elements 20*b* and the grounded common collecting electrode 81 are equipotential. When so connected, excessive charges will not be accumulated on the supporting multilayer piezoelectric elements 20*b* even if charges developed in the driving multilayer piezoelectric elements 20*a* migrate to the supporting multilayer piezoelectric elements 20*b***.

The front member 50 of the ink-jet head in the first embodiment may be relatively thin and the front member 50 of the ink-jet head in the second embodiment may be relatively thick. The thickness of the front member 50 may be dependent on preference for either the effect of the front member 50 as a support member or the effect in efficiently forming ink particles by reducing the distance between the ink chambers 41 and the corresponding nozzle holes 61.

Although the method of manufacturing the ink-jet head in the second embodiment has a cutting process for cutting the back end portion 28 of the multilayer piezoelectric block 27, the cutting process may be omitted to simplify the method.

Although the foregoing embodiments employ the nozzle plate 60, the ink outlets 43 of the flow passage plate 40 may be formed in the shape of a nozzle and the nozzle plate 60 may be omitted.

CAPABILITY OF EXPLOITATION IN INDUSTRY

The present invention is applicable to ink-jet print heads for various types of ink-jet printers.

What is claimed is:

1. An ink-jet head manufacturing method comprising:

a step of multilayer piezoelectric block bonding including:

forming a multilayer piezoelectric block by alternately stacking conductive members and piezoelectric plates to form a stack, said piezoelectric plates being stacked so as to be polarized in a direction of a thickness of said piezoelectric plates;

placing first and second nondriven layers, which are not distorted even when voltage is applied thereto, at opposite ends of said stack of said conductive members alternating with said piezoelectric plates with respect to a direction of stacking;

bonding said multilayer piezoelectric block to a base;

a step of slit forming including:

forming a plurality of longitudinal slits of a depth at least from a surface of said second nondriven layer to a middle portion of said first nondriven layer in said multilayer piezoelectric block at fixed intervals to form a plurality of multilayer piezoelectric elements spaced by said slits;

a step of front member bonding including:

bonding a front member to front end surfaces of said base and said multilayer piezoelectric block;

a step of back member bonding including:

bonding a back member to back end surfaces of said base and said multilayer piezoelectric block;

a step of oscillation plate bonding including:

simultaneously grinding surfaces of said second nondriven layers of said multilayer piezoelectric elements, an end portion of said front member on a side of a portion in contact with said second nondriven layers, and an end portion of said back member of a side of a portion in contact with said second nondriven layers so that said surfaces of said second nondriven layers of said multilayer piezoelectric elements, said end portion of said front member, and said end portion of said back member are flush with each other; and bonding a first flat surface of said oscillation plate to said surfaces of said second nondriven layers of said multilayer piezoelectric elements, said end portion of said front member and said end portion of said back member; and a step of flow passage plate bonding including:

preparing a flow passage plate provided with a plurality of ink outlets in a front end thereof and a plurality of juxtaposed ink chambers connected to said ink outlets; and bonding said flow passages to a second surface of said oscillation plate with said ink chambers thereof arranged in a direction of distortion of said multilayer piezoelectric elements.

2. The ink-jet head manufacturing method according to claim 1, further comprising a step of preparing a nozzle plate provided with a plurality of nozzle holes, wherein said nozzle plate preparation step includes:

after completion of said steps of multilayer piezoelectric block bonding, oscillation plate bonding, front member bonding and flow passage plate bonding, simultaneously grinding said front surface of said front member to form a ground front surface thereof, said front end of said oscillation plate to form a ground front end thereof, and said front end of said flow passage plate to form a ground front end thereof, so that said front surface of said front member, said front end of said oscillation plate and said front end of said flow passage plate are flush with each other; and bonding said nozzle plate to said ground front surface of said front member, said ground front end of said oscillation plate and said ground front end of said flow passage plate with said nozzle holes connected to said ink outlets of said flow passage plate.

3. The ink-jet manufacturing method according to claim 1, further comprising said steps of:

exposing at least a back section of said surface of said base to which said multilayer piezoelectric block is bonded in said step of multilayer piezoelectric block bonding;

forming an electrode film after completion of said step of multilayer piezoelectric block bonding over at least an exposed portion of said front and back end surfaces of said multilayer piezoelectric block and an exposed back section of said surface of said base; and forming said slits with a depth from said surface of said second nondriven layer of each multilayer piezoelectric element to a middle of a thickness of said base so as to extend to said back end of said base to form a driving collecting electrode connected to a portion of said electrode film formed on said surface of said back end of said multilayer piezoelectric block by a portion of said electrode film formed on said back end of said base, and to form a common collecting electrode by a portion of said electrode film formed on said front end of said multilayer piezoelectric block.

4. The ink-jet head manufacturing method according to claim 1, further comprising the steps of:

forming said surface of said base in a stepped-shape having a shoulder, wherein a thickness of said first nondriven layer of said multilayer piezoelectric block is greater than a height of said shoulder;

bonding said first nondriven layer of said multilayer piezoelectric block to a recessed section of said surface of said base so as to be in contact with said shoulder by means of said step of multilayer piezoelectric block bonding;

forming an electrode film at least on exposed front and back surfaces of said multilayer piezoelectric block and forming a raised section of said surface of said base, after bonding said multilayer piezoelectric block to said base; and forming said slits so as to extend through said raised section of said surface of said base by said step of forming slit to form a driving collecting electrode connected to a portion of said electrode film formed on said raised section of said surface of said base and to form a common collecting electrode by a portion of said electrode film formed on said front end surface of said multilayer piezoelectric block.

5. The ink-jet head manufacturing method according to claim 1, further comprising the steps of:

forming said surface of said base so as to have a shoulder, wherein a thickness of said first nondriven layer of said multilayer piezoelectric block is greater that a height of said shoulder;

bonding said first nondriven layer of said multilayer piezoelectric block to a recessed section of said surface of said base so as to be in contact with said shoulder by said step of multilayer piezoelectric block bonding;

cutting off a portion of any width of said back end portion of said multilayer piezoelectric block to form a cut surface so that said surface of said remaining portion of said back end portion is flush with a raised section of said surface of said base after bonding said first nondriven layer of said multilayer piezoelectric block to said base;

forming an electrode film at least on said front surface of said multilayer piezoelectric block, said cut surface of said multilayer piezoelectric block, and said raised section of said surface of said base, after cutting said portion of any width of said back end portion of said multilayer piezoelectric block; and forming said slits so as to extend through said raised section of said surface of said base by said step of slit forming to form a driving collecting electrode connected to a portion of said electrode film formed on said cut surface of said multilayer piezoelectric block by a portion of said electrode film formed on said raised section of said surface of said base, and to form a common collecting electrode by a portion of said electrode film formed on said front end surface of said multilayer piezoelectric block.

* * * * *